(12) United States Patent
Kim et al.

(10) Patent No.: US 11,677,277 B2
(45) Date of Patent: Jun. 13, 2023

(54) SHAPE DESIGN SYSTEM AND METHOD FOR WIRELESS POWER TRANSMISSION SYSTEM

(71) Applicant: GWANGJU INSTITUTE OF SCIENCE AND TECHNOLOGY, Gwangju (KR)

(72) Inventors: Yun Su Kim, Gwangju (KR); Byeung Guk Choi, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 227 days.

(21) Appl. No.: 17/419,490

(22) PCT Filed: Feb. 26, 2020

(86) PCT No.: PCT/KR2020/002747
§ 371 (c)(1),
(2) Date: Jun. 29, 2021

(87) PCT Pub. No.: WO2020/175912
PCT Pub. Date: Sep. 3, 2020

(65) Prior Publication Data
US 2022/0094211 A1    Mar. 24, 2022

(30) Foreign Application Priority Data

Feb. 26, 2019  (KR) .................. 10-2019-0022559

(51) Int. Cl.
*H02J 50/80*    (2016.01)
*H02J 50/10*    (2016.01)
(Continued)

(52) U.S. Cl.
CPC .............. *H02J 50/80* (2016.02); *G06F 30/27* (2020.01); *G06V 10/255* (2022.01); *G06V 20/64* (2022.01); *H02J 50/10* (2016.02)

(58) Field of Classification Search
CPC .......... H02J 50/80; H02J 50/10; G06F 30/27; G06V 20/64; G06V 10/255
(Continued)

(56) References Cited

U.S. PATENT DOCUMENTS

2015/0302985 A1* 10/2015 Kurs ................... H01F 3/10
                                                             336/119
2016/0013661 A1*  1/2016 Kurs ................. H02J 50/005
                                                             307/104
(Continued)

FOREIGN PATENT DOCUMENTS

JP    2015-106731 A    6/2015
KR  10-2013-0051659 A  5/2013
(Continued)

OTHER PUBLICATIONS

Seung Beop Lee et al., "Layout optimization of the secondary coils for wireless power transfer systems", 2015 IEEE Wireless Power Transfer Conference (WPTC), May 15, 2015, <http://lps3.ieeexplore.ieee.org.libra.kaist.ac.kr/document/7140175> pp. 1-4.

*Primary Examiner* — Alfonso Perez Borroto
(74) *Attorney, Agent, or Firm* — Bridgeway IP Law Group, PLLC; Jihun Kim

(57) ABSTRACT

Proposed is a shape design technology for a wireless power transmission system, the shape design system including: a learning module configured to perform learning based on shape information and compensation information input in relation to a design target and generate new shape information; and an analysis module configured to evaluate wireless power transmission performance based on the shape infor-
(Continued)

mation from the learning module and provide the learning module with a performance evaluation result.

20 Claims, 13 Drawing Sheets

(51) Int. Cl.
*G06F 30/27* (2020.01)
*G06V 20/64* (2022.01)
*G06V 10/20* (2022.01)

(58) Field of Classification Search
USPC .......................................................... 307/104
See application file for complete search history.

(56) References Cited

U.S. PATENT DOCUMENTS

2016/0379753 A1* 12/2016 Jang ..................... H01F 38/14
703/1
2018/0096788 A1* 4/2018 Kurs ..................... H02J 50/70

FOREIGN PATENT DOCUMENTS

| KR | 10-2016-0043678 A | 4/2016 |
| KR | 10-2017-0002257 A | 1/2017 |
| KR | 10-2017-0046494 A | 5/2017 |
| KR | 10-2018-0120061 A | 11/2018 |

\* cited by examiner

SHAPE DESIGN SYSTEM AND METHOD FOR WIRELESS POWER TRANSMISSION SYSTEM

TECHNICAL FIELD

The present invention relates to a shape design technology for a wireless power transmission system, and particularly, to a system and a method of designing a core and a coil optimized for a wireless power transmission system by using machine learning.

BACKGROUND ART

Recently, in order to solve various problems of the terminal connection type charging technology, a wireless power transmission technology for wirelessly transmission power to a power receiving device has been proposed.

In the wireless power transmission technology, for example, a wireless power transmission device transmits power to a power receiving device by using an electromagnetic induction method, and the power receiving device receives the power wirelessly transmitted from the wireless power transmission device and charges a battery with the received power.

A lot of research is being conducted on the technology in which the wireless power transmission device transmits power wirelessly, stably, and with high efficiency, and the power receiving device maximally receives the power transmitted by the wireless power transmission device and charges a battery.

Each of the wireless power transmission device and the power receiving device includes a core assembly, and the core assembly is formed of a core and a coil.

In the wireless power transmission technology in an induction coupling method using a magnetic field, a ferrite core is used to increase a collection speed of the magnetic field and change a distribution of the magnetic field.

In order to increase efficiency and the amount of power transmitted of the wireless power transmission, it is preferable that a coupling coefficient between the coil of the wireless power transmission device and the coil of the power receiving device is set as high as possible.

For example, there is a method of setting an optimal coupling coefficient through a shape of a ferrite core, and in the related art, a designer designed a shape of a ferrite core by intuitively designing a shape of a ferrite core under a condition limit of a system and then swiping several variables through a simulation.

Accordingly, in the related art, the ferrite core was designed based on the intuition of the designer, so that there are many difficulties in designing an optimal shape of the ferrite core, and it was difficult to be sure whether the shape of the ferrite core designed in this way would produce the optimal coupling coefficient.

PRIOR ART LITERATURE

Patent Document (Patent Document 1) Korean Patent Application Laid-Open No. 10-2013-0051659 (published on May 21, 2013)

(Patent Document 2) Korean Patent Application Laid-Open No. 10-2016-0043678 (published on Apr. 22, 2016)

DISCLOSURE

Technical Problem

The present invention is conceived to solve the problems in the related art, and aims to provide a shape design system and method for a wireless power transmission system, which design an optimal core shape or coil shape through learning in order to maximize wireless power transmission efficiency and the amount of power transmitted.

The technical problem of the present invention is not limited to the mentioned matters, and those skilled in the art may clearly understand other objects intended by the present invention from the description contents below.

Technical Solution

An exemplary embodiment of the present invention for solving the foregoing object provides a shape design system for a wireless power transmission system, the shape design system including: a learning module configured to perform learning based on shape information and compensation information input in relation to a design target and generate new shape information; and an analysis module configured to evaluate wireless power transmission performance based on the shape information from the learning module and provide the learning module with a performance evaluation result.

The shape information may be formed of a matrix structure consisting of a plurality of components used for regulating a shape of the design target.

The learning module may be implemented to change a value of the component in the shape information through a learning process and change the shape of the design target.

All of the components in the shape information may have an initial value at an initial stage, and have the initial value or a setting value according to a learning performance result after the learning by compensation is performed.

The learning module may be implemented to perform the learning by receiving initial shape information at an initial stage of the learning, and then perform the learning based on new shape information generated as a result of the learning and the performance evaluation result from the analysis module.

The analysis module may be implemented to perform an analysis on performance influencing variables when the wireless power transmission performance is evaluated, and evaluate the wireless power transmission performance based on an analysis result.

The performance influencing variable may include at least one or more selected from magnetic flux density, transmission coil inductance, reception coil inductance, mutual inductance between a transmitter and a receiver, a coupling coefficient, transmission coil resistance, reception coil resistance, received power, and system efficiency.

The learning module may be implemented to continuously perform the learning based on the shape information and the performance evaluation result until a predetermined learning termination condition is satisfied.

The learning module may be implemented to count the number of times of the learning performance after the learning performance, and determine that the learning termination condition is satisfied when the number of times of the learning performance reaches the maximum number of times of the learning performance.

The learning module may be implemented to compare a previous performance evaluation result and a current performance evaluation result, and determine that the learning termination condition is satisfied when a difference between the two results is within a set range.

The component in the shape information may be imaged and displayed in a block on an output module, a size of the block may be adjustable, and the block may be imaged and displayed on two-dimensionally or three-dimensionally.

Another exemplary embodiment of the present invention provides a shape design method for a wireless power transmission system, the shape design method including: inputting initial shape information related to a design target; generating learning shape information by performing learning based on the initial shape information; evaluating wireless power transmission performance through an analysis of the learning shape information and then generating a performance evaluation result; and generating new learning shape information by performing learning based on the performance evaluation result and the learning shape information.

The initial shape information may have an initial value, and may have a matrix structure consisting of a plurality of components used for regulating a shape of the design target.

The component in the initial shape information may be changed according to the performance of the learning, so that the learning shape information may be generated.

The analysis of the learning shape information may be performed on performance influencing variables affecting performance of the wireless power transmission.

The performance influencing variable may include at least one or more selected from magnetic flux density, transmission coil inductance, reception coil inductance, mutual inductance between a transmitter and a receiver, a coupling coefficient, transmission coil resistance, reception coil resistance, received power, and system efficiency.

The generating of the performance evaluation result and the generating of the new learning shape information may be continuously performed until a predetermined termination condition is satisfied.

The termination condition may be the case where the number of times of the learning performance counted according to the learning performance reaches the maximum number of times of the learning performance.

The termination condition may be the case where a difference between a previous performance evaluation result and a current performance evaluation result is within a set range.

The method may further include imaging the component in the shape information in a block having a preset size and displaying the imaged block on two-dimensionally or three-dimensionally.

Advantageous Effects

By using the shape design technology for the wireless power transmission system according to the exemplary embodiment of the present invention, it is possible to evaluate wireless power transmission performance based on a shape of a core or a shape of a coil designed through learning.

Further, it is possible to design a shape of a core or a shape of a coil that can expect better performance by using a result of the evaluation of the wireless power transmission performance in learning, and it is possible to design an optimal core shape or coil shape based on the learning and the performance evaluation, thereby maximizing efficiency of wireless power transmission and the amount of power transmitted of the wireless power transmission system.

DESCRIPTION OF DRAWINGS

Hereinafter, the accompanying drawings are for helping the present exemplary embodiment, and provide the exemplary embodiments together with the detailed description. However, the technical characteristic of the present exemplary embodiment is not limited to a specific drawing, and the characteristics disclosed in each drawing may be combined with each other to be formed as a new exemplary embodiment.

MODE FOR CARRYING OUT THE INVENTION

Figure 1:
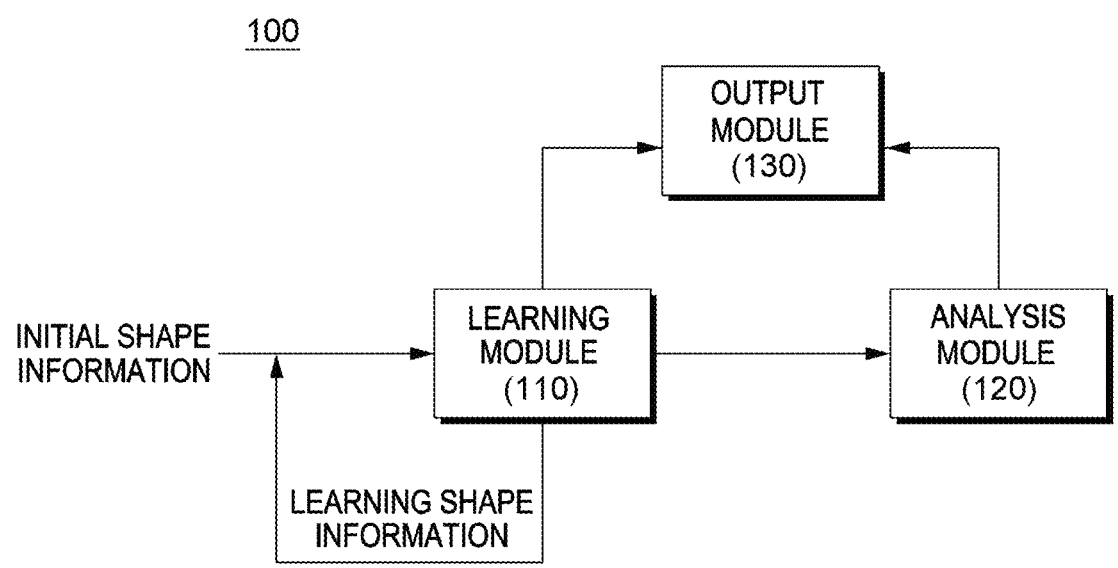
FIG. 1 is a diagram illustrating a configuration of an example of a shape design system for a wireless power transmission system according to an exemplary embodiment of the present invention.

In the exemplary embodiments of the present invention disclosed in the context, specific structural or functional descriptions are only exemplified for the purpose of describing the exemplary embodiments of the present invention, and the exemplary embodiments of the present invention may be carried out in various forms, and it should not be construed that the present invention is limited to the exemplary embodiments described in the context.

The present invention may have various modifications and forms and thus specific exemplary embodiments will be illustrated in the drawings and described in the context in detail. However, it is not intended to limit the present invention to the specific disclosed form, and it will be appreciated that the present invention includes all modifications, equivalences, or substitutions included in the spirit and the technical scope of the present invention.

Terms, such as first and second, may be used for describing various constituent elements, but the constituent elements are not limited by the terms. The terms are used only to discriminate one constituent element from another constituent element. For example, without departing from the scope of the present invention, a first constituent element may be named as a second constituent element, and similarly a second constituent element may also be named as a first constituent element.

It should be understood that when one constituent element is referred to as being "coupled to" or "connected to" another constituent element, one constituent element can be directly coupled to or connected to the other constituent element, but intervening elements may also be present. By contrast, when one constituent element is referred to as being "directly coupled to" or "directly connected to" another constituent element, it should be understood that there are no intervening elements. Other expressions, that is, "between ~" and "just between ~" or "adjacent to ~" and "directly adjacent to ~", explaining a relationship between constituent elements, should be interpreted in a similar manner.

Terms used in the present application are used only to describe specific exemplary embodiments, and are not intended to limit the present invention. Singular expressions used herein include plurals expressions unless they have definitely opposite meanings in the context. In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

In the meantime, when a specific exemplary embodiment can be implemented differently, a function or operation specified in a specific block may also occur differently from the order specified in a flowchart. For example, two consecutive blocks may be actually performed substantially simultaneously, or the blocks may be performed in reverse depending on a function or operation involved.

Hereinafter, a shape design system for a wireless power transmission system according to an exemplary embodiment of the present invention and a shape design method for a wireless power transmission system using the same will be described in detail with reference to the accompanying drawing.

A shape design technology for a wireless power transmission system suggested in the present invention is based on the premise that a design target (core or coil) is composed of a combination of a plurality of blocks, and information that is initially input for learning defines the number of blocks in the combination configuring the design target, and data within the information is changed during the learning process.

Hereinafter, the information initially input for learning is referred to as "initial shape information" and the information input during the learning process is "learning shape information", and the shape information means the shape of the design target (or core or coil). Accordingly, by imaging the shape information, the shape of the design target may be visually checked.

When the shape design technology for the wireless power transmission system of the present invention is used in a design of a shape of a core, the initial shape information is called "initial core shape information", and when the shape design technology for the wireless power transmission system of the present invention is used in a design of a shape of a coil, the initial shape information is called "initial coil shape information".

The learning of the shape information in the present invention means the change of the predetermined number (for example, 8) of components among the component in the shape information.

The present invention provides a technology of designing a shape of a design target which is capable of optimizing a wireless power transmission function through a learning process of changing shape information.

In the exemplary embodiment, the shape information is formed of a matrix structure consisting of a plurality of components, and the component within the initial shape information is set with an initial value (for example, 0). Accordingly, the initial shape information may be the matrix in which all of the components are set with the initial value.

Further, each component of the matrix indicates whether each component is used for designing a shape of a design target, and the initial value indicates that the corresponding component is not used for designing the shape of the design target.

For example, the shape design system implemented to use a 4×4 matrix for designing a shape of a design target may receive initial shape information for the design target as described below.

[Example of Initial Shape Information]

$$\begin{bmatrix} 0 & 0 & 0 & 0 \\ 0 & 0 & 0 & 0 \\ 0 & 0 & 0 & 0 \\ 0 & 0 & 0 & 0 \end{bmatrix}$$

The 4×4 matrix means that the design target is formed of a combination of 16 blocks, and all of the components within the matrix are set with the initial value (0).

In the meantime, a value of each component of the matrix may be changed during the learning process, and hereinafter, a value (for example, 1) of a component of which the state is changed according to the use in the shape design is set to a "setting value".

The meaning of the initial value (0) within the matrix is to set the block to "vacuum", which means a block that is not used to form a design target and does not affect wireless power transmission performance.

Further, the meaning of the setting value (1) within the matrix is to set the block as a "core", which means a block that is used to form a design target and affects wireless power transmission performance. As described above, each component within the matrix means an individual block for designing the shape of the design target, and when the component in the matrix is imaged, a size of the block may be adjusted.

For example, the block may be set to be a regular hexagon with a width of 1 cm, a length of 1 cm, and a height of 1 cm, but the shape and the size of the block may be variously changed.

Further, when the design target is designed, the block may be imaged not only two-dimensionally but also three-dimensionally, so that two-dimensional modelling and three-dimensional modelling are possible.

For example, when a 4×4 matrix in which all of the components are set with the initial value (0) is input as initial shape information, and (1, 2) component, (1, 4) component, (2, 2) component, (2, 4) component, (3, 1) component, (3, 3) component, (4, 2) component, and (4, 3) component are used for the shape design of the design target through the learning process, learning shape information of the 4×4 matrix is generated as described below.

[Example of Learning Shape Information]

$$\begin{bmatrix} 0 & 1 & 0 & 1 \\ 0 & 1 & 0 & 1 \\ 1 & 0 & 1 & 0 \\ 0 & 1 & 1 & 0 \end{bmatrix}$$

That is, a component used as a part of the shape of the design target among the components within the input matrix as the initial shape information has the setting value (1).

The learning shape information of the 4×4 matrix may be changed again in a next learning process, and it is possible to design a core shape and a coil shape that may optimize the wireless power transmission function through the learning process.

In the meantime, in the foregoing example, the two-dimensional matrix is input as the shape information for the design target, but a three-dimensional matrix may also be input as shape information.

FIG. 1 is a diagram illustrating a configuration of an example of a shape design system for a wireless power transmission system according to an exemplary embodiment of the present invention.

The shape design system (hereinafter, referred to as "the system") 100 for the wireless power transmission system according to the exemplary embodiment of the present invention is implemented to design a shape optimal to a design target through a process of performing learning based on input shape information, evaluating wireless power transmission performance based on shape information generated as a performance result, reflecting the performance evaluation result, and learning the shape information after the learning again.

The system 100 may design shapes optimal to various configurations provided in the wireless power transmission system, and may be used for, for example, designing a shape optimal to the core and the coil.

When the system 100 learns the shape information again after the learning by reflecting the performance evaluation result, the system 100 changes the shape information in a direction making the performance evaluation result better.

The system 100 may be implemented to perform the learning for the shape of the design target by machine learning, and may use, for example, supervised learning, semi-supervised learning, unsupervised learning, and reinforcement learning.

In the present exemplary embodiment, the system 100 may perform learning for the shape of the design target through the reinforcement learning, and may use, for example, a Q-learning algorithm.

When the wireless power transmission performance is evaluated, the system 100 may analyze variables ("performance influencing variables") affecting the performance of the wireless power transmission, and evaluate the wireless power transmission performance based on the analysis result. Further, the evaluation of the wireless power transmission performance is used as reward in a next learning process.

For example, the performance influencing variable may include magnetic flux density, transmission coil inductance, reception coil inductance, mutual inductance between a transmitter and a receiver, a coupling coefficient, transmission coil resistance, reception coil resistance, received power, and system efficiency.

That is, the wireless power transmission performance may be changed according to a change in magnetic flux density, transmission coil inductance, reception coil inductance, mutual inductance between a transmitter and a receiver, a coupling coefficient, transmission coil resistance, reception coil resistance, received power, and system efficiency.

As described above, by reflecting the comprehensive analysis of the performance influencing variables affecting the wireless power transmission to the design of the core and the coil, it is possible to improve efficiency of the wireless power transmission and design the core and coil capable of increasing the amount of power transmitted.

When the system 100 evaluates the performance of the wireless power transmission, various types of simulation programs may be used, and may use programs, such as ANSYS Maxwell, PSIM, and SNSYS Simplorer.

The wireless power transmission system includes a wireless power transmission device which wirelessly transmit power, and a power reception device which receives power wirelessly transmitted from the wireless power transmission device, and each of the wireless power transmission device and the power reception device includes a core and a coil.

The system 100 may design all of the shapes of the core and the coil of the wireless power transmission device and the shapes of the core and the coil of the power reception device, and the core shape (or the coil shape) of the wireless power transmission device may be designed to be the same as the core shape (or the coil shape) of the power reception device, but may also be differently designed.

The system 100 may not only design a transmission core which is optimized to transmit wireless power while being matched to one reception core, but also design a transmission core which is optimized to transmit wireless power while being matched to a plurality of reception cores.

Referring to FIG. 1, the system 100 may be formed of a learning module 110, an analysis module 120, and an output module 130, but the configuration of the system 100 illustrated in FIG. 1 is an example for description, and the system 100 may be variously changed in design.

As described above, the system 100 may design optimal shapes for various configurations provided in the wireless power transmission system, and for convenience of the description, and for convenience of the description, it is assumed that the system 100 designs the optimal shape for the core hereinafter.

The learning module 110 may include an engine performing learning for designing the core shape in the present invention, and may perform learning based on the input core shape information and generate post-learning (or new) core shape information as the performance result.

Further, the learning module 110 may perform learning of the core shape information by reflecting the information from the analysis module 120.

According to the performance of the learning of the learning module 110, the values of the components in the core shape information may be changed, and for example, the initial value (0) may be set to the setting value (1), and the setting value (1) may be changed to the initial value (0).

As a matter of course, even though the learning of the learning module 110 is performed, there may be components that are not changed among the component in the core shape information.

In particular, at the initial stage of the learning, the learning module 110 receives initial core shape information, perform learning based on the received initial core shape information, and generates learning core shape information as the learning performance result.

The generated learning core shape information is provided to the analysis module 120, the analysis module 120 evaluates wireless power transmission performance based on the received learning core shape information and then provides the learning module 110 with the performance evaluation result.

Accordingly, the learning module 110 generates new learning core shape information by performing learning of the previous learning core shape information by reflecting the performance evaluation result from the analysis module 120, and the newly generated learning core shape information is provided to the analysis module 120 again.

When the learning module 110 learns the previous core shape information again by reflecting the performance evaluation result, the learning module 110 generates the core shape information in the direction making the performance evaluation result better.

For example, the learning module 110 may perform the learning for the core shape information by using the Q-learning algorithm that is one of the reinforcement learning, and may generate the core shape information according to the E-greedy policy.

Further, the learning module 110 performs a learning operation and then performs an operation for determining whether a condition for terminating the learning operation is satisfied.

For example, the learning module 110 may count the number of times of the learning performance after the performance of the learning, and when the number of times of the learning performance reaches a predetermined maximum number of times of the learning performance, the learning module 110 may terminate the learning operation.

For another example, the learning module 110 may compare a previous performance evaluation result with a current performance evaluation result, and when a difference between the two results is within a set range, the learning module 110 may terminate the learning operation.

The analysis module 120 may include an engine for evaluating the wireless power transmission performance based on the core shape information of the present invention, and evaluates wireless power transmission performance based on the learning core shape information provided from the learning module 110 and then provides the learning module 110 with the performance evaluation result.

When the wireless power transmission performance is evaluated, the analysis module 120 perform the analysis on the variables (performance influencing variables) affecting the performance of the wireless power transmission, and evaluate the wireless power transmission performance based on the analysis result.

For example, the analysis module 120 may analyze magnetic flux density, transmission coil inductance, reception coil inductance, mutual inductance between a transmitter and a receiver, a coupling coefficient, transmission coil resistance, reception coil resistance, received power, system efficiency, and the like, and in addition to the mentioned parameters, any parameter that can affect the performance of the wireless power transmission may be analyzed. When the analysis module 120 evaluates the performance of the wireless power transmission, various types of simulation programs may be used, and may use programs, such as ANSYS Maxwell, PSIM, and SNSYS Simplorer.

The analysis module 120 may perform the analysis on the performance influencing variable and the evaluation on the wireless power transmission performance by applying the core shape information to a predetermined program.

The condition applied for the analysis may be variously set, and for example, a block configuring the core is set to be a regular hexagon with a width of 1 cm, a length of 1 cm, and a height of 1 cm, but the shape and the size of the block configuring the core may be variously changed.

Further, the core for transmission and the core for reception may be set to have the same shape, and a spaced distance (for example, 10 cm) between the core for transmission and the core for reception may be set, and a material of the core may be set to ferrite or amorphous, and in addition to this, various conditions may be set.

The output module 130 is implemented to output information from the outside according to a predetermined display method.

In the present exemplary embodiment, the output module 130 may receive the core shape information from the learning module 110 and output the received core shape information.

For example, the output module 130 may output the core shape information in the form of a one-dimensional or two-dimensional matrix, and depending on an exemplary embodiment, the output module 130 may output the core shape information in the form of a two-dimensional or three-dimensional block disposition.

In the present exemplary embodiment, the output module 130 may output the analysis process, the analysis result, the evaluation result of the wireless power transmission performance, and the like of the analysis module 120.

In the foregoing, the configuration of the shape design system for the wireless power transmission system according to the exemplary embodiment of the present invention and the function of each configuration have been described reviewed. Hereinafter, a method of designing a shape of a design target by using the shape design system for the wireless power transmission system according to the exemplary embodiment of the present invention will be described.

Figure 2:
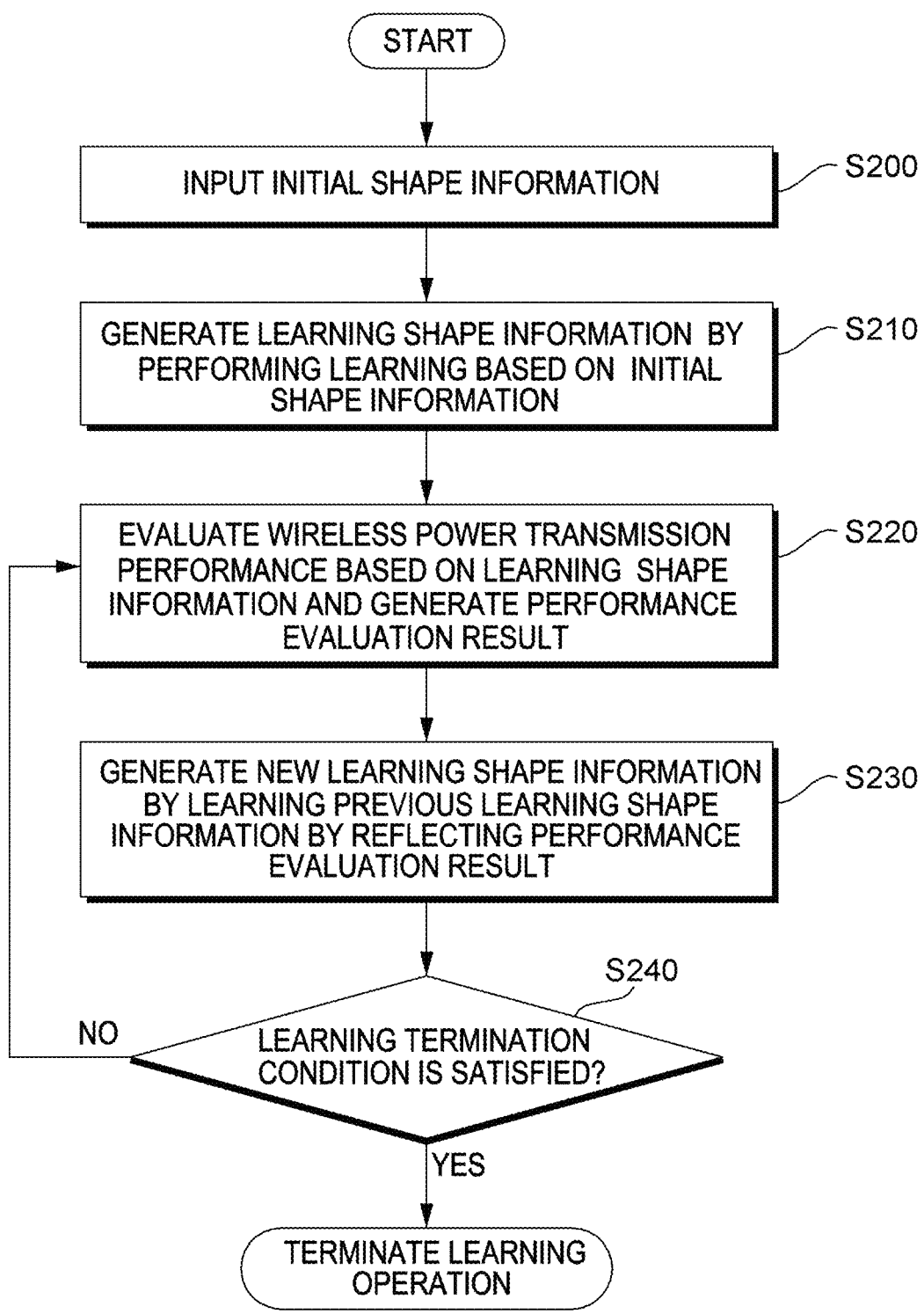
FIG. 2 is a flowchart for describing a shape design method for a wireless power transmission system according to an exemplary embodiment of the present invention.

FIG. 2 is a flowchart for describing a shape design method for a wireless power transmission system according to an exemplary embodiment of the present invention.

Each operation illustrated in FIG. 2 may be performed by the system 100 of FIG. 1, and initial shape information is input to the learning module 110 at an initial stage of an operation (S200).

In operation S200, "initial core shape information" is input when a shape for a core is designed, and "initial coil shape information" is input when a shape for a coil is designed.

In operation S200, the initial shape information is formed in a matrix structure consisting of a plurality of components, and the component within the initial shape information is set with an initial value (for example, 0).

Accordingly, the initial shape information input in operation S200 may be the matrix in which all of the components are set with the initial value.

In operation S200, the initial shape information input to the learning module 110 may be input to the output module 130 and displayed.

After operation S200, the learning module 110 operates according to a predetermined learning algorithm (for example, Q-learning algorithm) and generates learning shape information by performing learning based on the initial shape information (S210).

In operation S210, "learning core shape information" is input when the shape for the core is designed, and "learning coil shape information" is generated when the shape for the coil is designed.

In operation S210, the value of the component in the initial shape information is changed according to the performance of the shape design through the learning, and a value of a predetermined component may be changed from the initial value (0) to the setting value (1).

The learning shape information generated according to operation S210 may be provided to the analysis module 120, and may be input to the output module 130 and displayed.

After operation S220, the analysis module 120 analyzes the learning shape information provided according to operation S210 by using a predetermined simulation program (for example, ANSYS Maxwell, PSIM, and SNSYS Simplorer), evaluates wireless power transmission performance, and then generates a performance evaluation result.

In operation S220, performance influencing variables affecting performance of the wireless power transmission may be analyzed, and the wireless power transmission performance may be evaluated based on the analysis result.

In this case, the performance influencing variable may include magnetic flux density, transmission coil inductance, reception coil inductance, mutual inductance between a transmitter and a receiver, a coupling coefficient, transmission coil resistance, reception coil resistance, received power, and system efficiency.

The performance evaluation result generated according to operation S220 is provided to the learning module 110, and the performance evaluation result is provided to the learning module 110 as a reward in the Q-learning algorithm.

Further, the performance evaluation result generated according to operation S220 may be input to the output module 130 and displayed.

After operation S220, the learning module 110 generates new learning shape information by performing learning of previous learning shape information by reflecting the evaluation result of the wireless power transmission performance provided according to operation S220 (S230).

In operation S230, according to the learning algorithm, new learning shape information for generating a higher performance evaluation result than the performance evaluation result generated based on the previous learning shape information is generated.

Accordingly, the component in the new learning shape information may have a different value from the value of the component in the previous learning shape information, and a value of a predetermined component may be changed from the initial value (0) to the setting value (1) or from setting value (1) to the initial value (0). As a matter of course, there may be components that have not been changed among the components in the new learning shape information.

The new learning shape information generated in operation S230 is provided to the analysis module 120 again, and the learning and analysis processes S220 and S230 are continuously performed until a predetermined termination condition is satisfied.

The shape design of the present invention is based on the premise that the design target is composed of a combination of a plurality of blocks, and accordingly, the number of total available combinations is determined according to the number of blocks, so that the termination condition may be determined based on a determination as to whether the learning has been performed as many as the total number of available combinations.

For example, when the learning has been performed as many as the total number of available combinations, the learning process is terminated, the learning shape corresponding to the learning shape information that generates the highest performance evaluation result among the performance evaluation results until the termination time is selected as an optimal shape, and the design target may be designed based on the selected optimal shape.

That is, the total number of available combinations of the blocks used for forming the design target may be set to the maximum number of times of the learning performance.

In the meantime, as the total number of blocks constituting the design target and the number of performance influencing variables that are the targets of the analysis increase, the time required for the learning and the analysis processes inevitably increases.

Accordingly, in order to reduce the time required for the learning process, the maximum number of times of the learning performance may be set through data accumulated through the repeated experiment, and the maximum number of times of the learning performance in this case is the number of times of the learning performance that makes the probability of designing an optimal shape for the design target satisfy a preset probability (for example, 90% or more).

However, in the foregoing example, the termination condition of the learning is set based on the number of times of the learning performance, but the present invention is not limited thereto.

For example, the termination condition of the learning may also be set based on a result of comparing the previous performance evaluation result and the current performance evaluation result and determining whether a difference between the two results is within a set range.

Herein, the set range may be set through data accumulated through the repeated experiment, and is the values determined so that the probability of designing an optimal shape for the design target satisfies a preset probability (for example, 90% or more).

Accordingly, after operation S230, the learning module 110 determines whether the termination condition of the learning is satisfied (S240), and when it is determined that the termination condition is satisfied (YES in S240), the learning module 110 terminates the learning operation.

As the result of the determination in operation S240, when it is determined that the termination condition is not satisfied (NO in S240), the learning module 110 provides the analysis module 120 with the new learning shape information to perform operation S220.

In operation S240, the learning module 110 may determine whether the number of times of the learning performance reaches the maximum number of times of the learning performance, and when the number of times of the learning performance reaches the maximum number of times of the learning performance, the learning module 110 may determine that the termination condition is satisfied, or the learning module 110 may compare the previous performance evaluation result with the current performance evaluation result and determine whether a difference between the two results is within a preset range, and when the difference between the two results is within the preset range, the learning module 110 may determine that the termination condition is satisfied.

Figure 3:
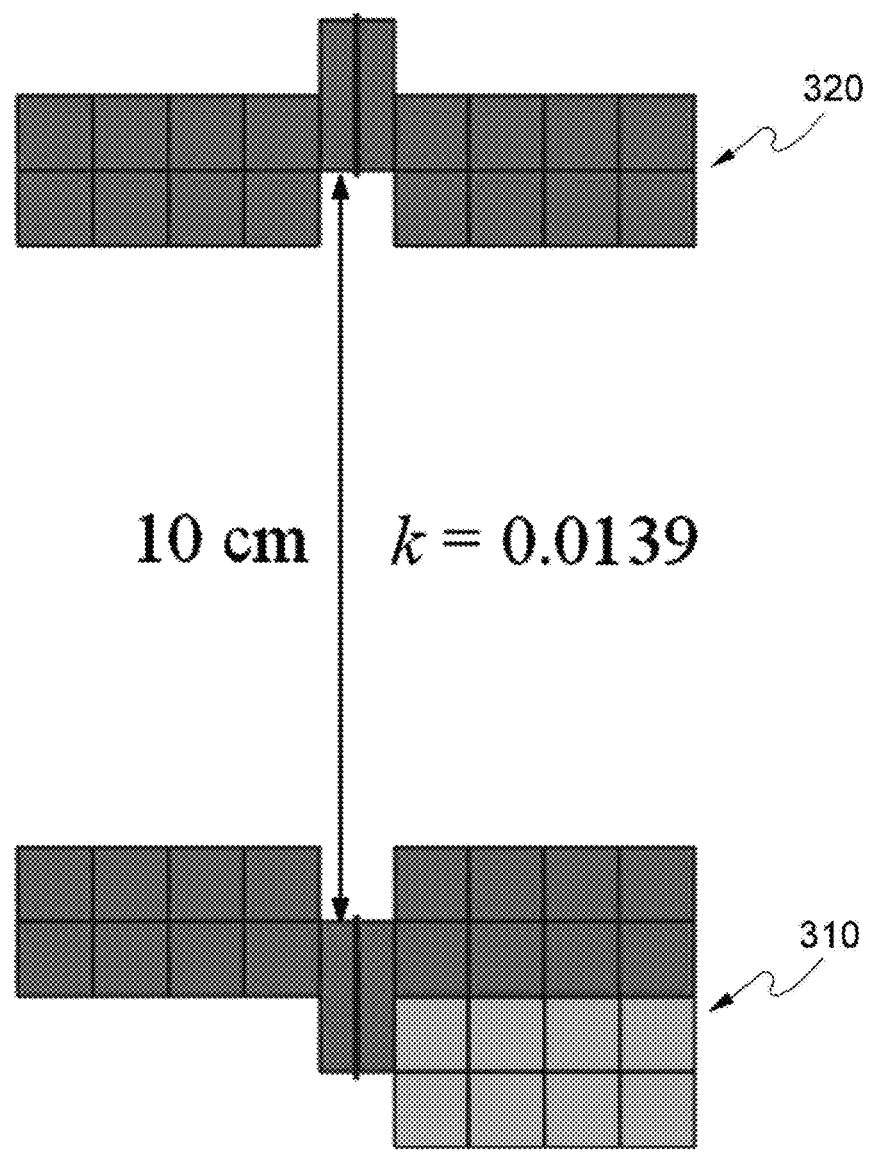
FIGS. 3 to 5 are diagrams illustrating comparison of performance of a core shape designed by using a shape design technology according to an exemplary embodiment of the present invention and performance of a core shape designed by an expert.
Figure 4:
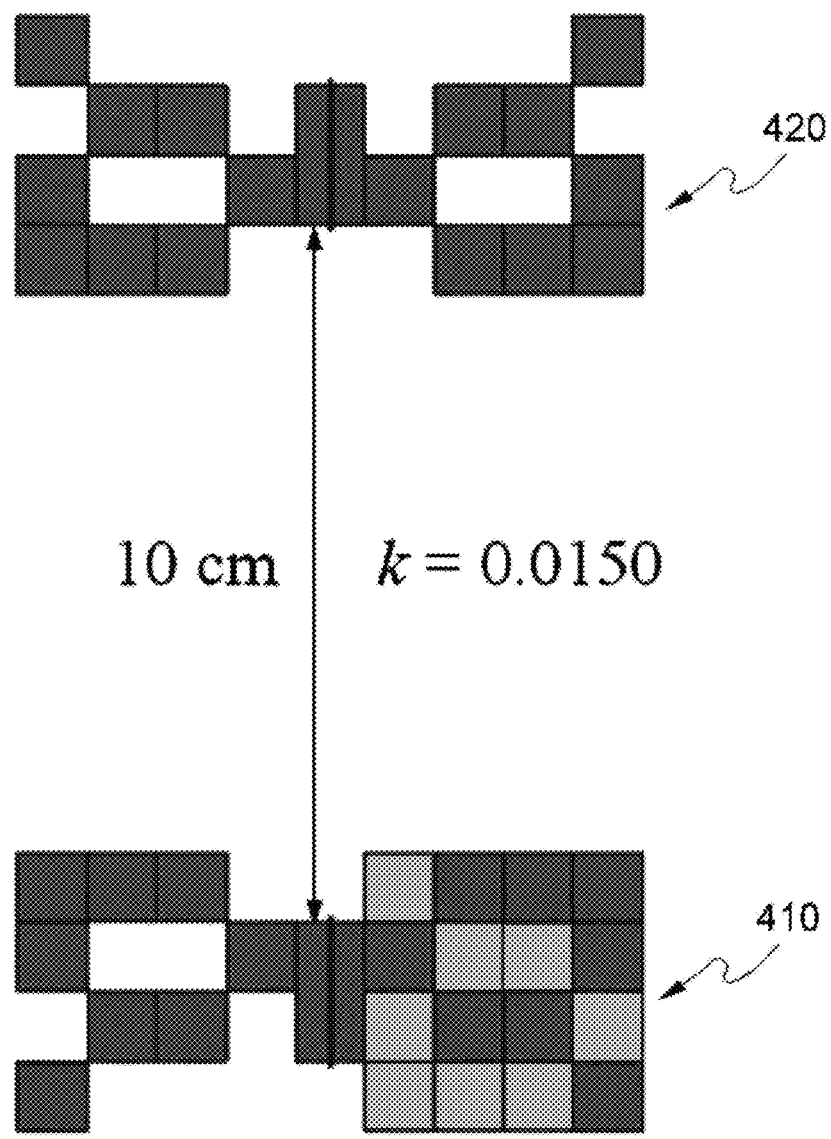
Figure 5:
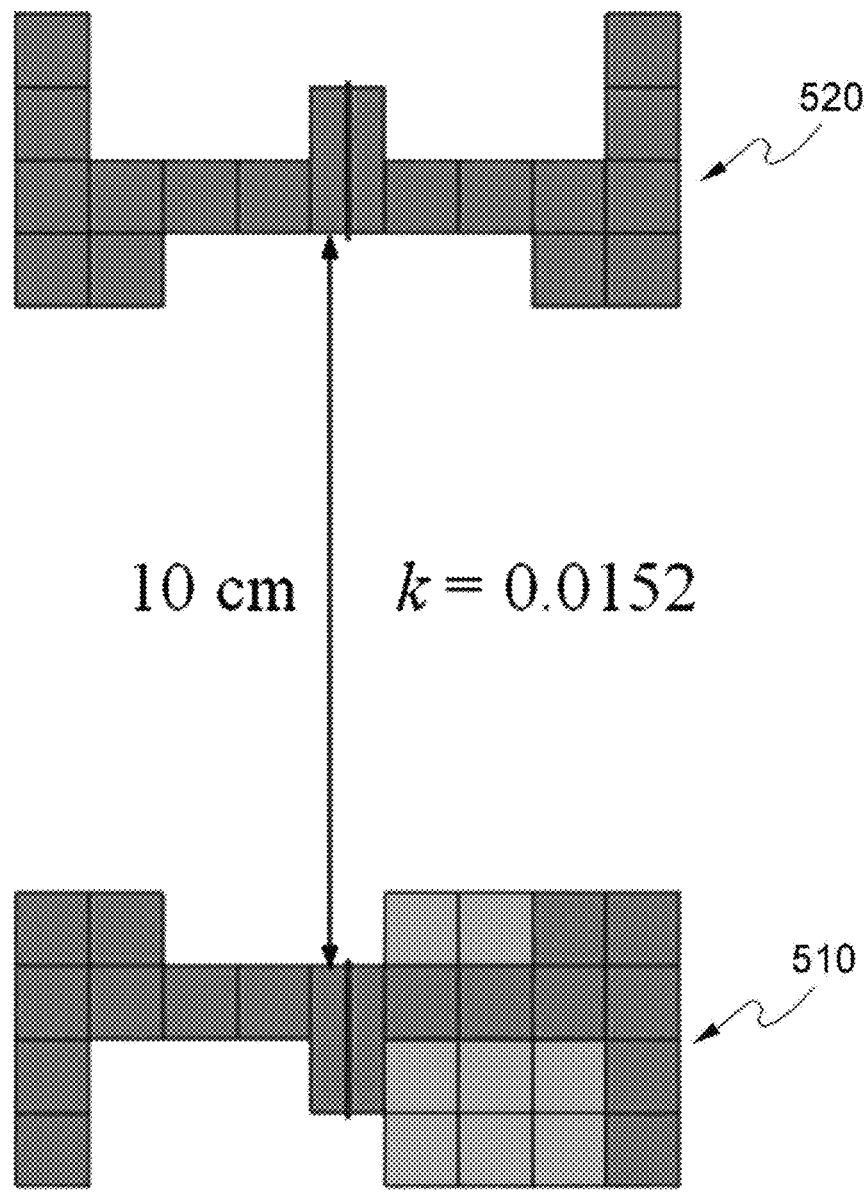

FIGS. 3 to 5 are diagrams illustrating comparison of performance of a core shape designed by using a shape design technology according to the exemplary embodiment of the present invention and performance of a core shape designed by an expert.

In the present exemplary embodiment, in order to measure coupling coefficients for the cores illustrated in FIGS. 3 to 5 and compare performance, other conditions other than the core shape are applied identically.

The core shape illustrated in FIG. 3 is the form designed by an expert, and a coupling coefficient (k) measured in the state where a transmission core 310 and a reception core 320 are spaced apart from each other by 10 cm is 0.0139.

The core shapes illustrated in FIGS. 4 and 5 are a first form and a second form designed by using the shape design technology of the present invention, and are the core forms designed in the case where the learning is performed 100 times.

As can be checked in FIG. 4, under the same condition as that of FIG. 3, a coupling coefficient (k) measured in the state where a transmission core 410 and a reception core 420 are spaced apart from each other by 10 cm is 0.0150.

Further, as can be checked in FIG. 5, under the same condition as that of FIG. 3, a coupling coefficient (k) measured in the state where a transmission core 510 and a reception core 520 are spaced apart from each other by 10 cm is 0.0152.

As can be seen from the experiment results, the coupling coefficient for the shape of the core designed by using the shape design technology of the present invention is higher than the coupling coefficient for the shape of the core designed by the expert, thereby improving wireless power transmission performance.

Figure 6:
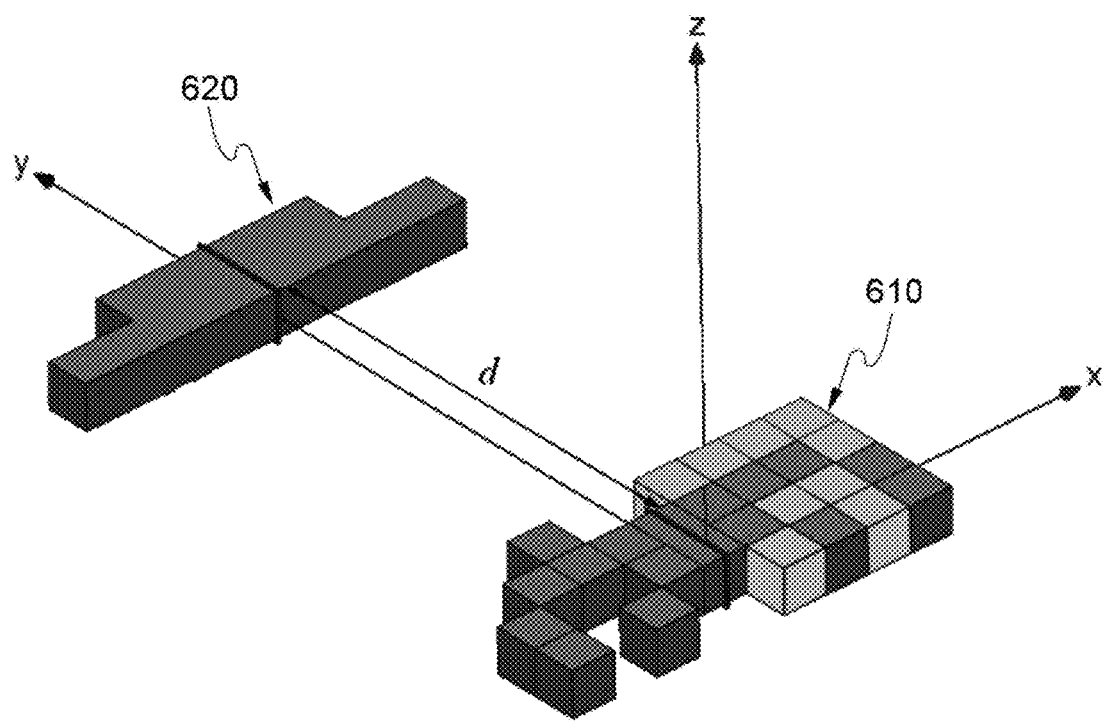
FIGS. 6 and 7 are diagrams illustrating examples of the cases where a core is designed by using the shape design technology according to the exemplary embodiment of the present invention.
Figure 7:
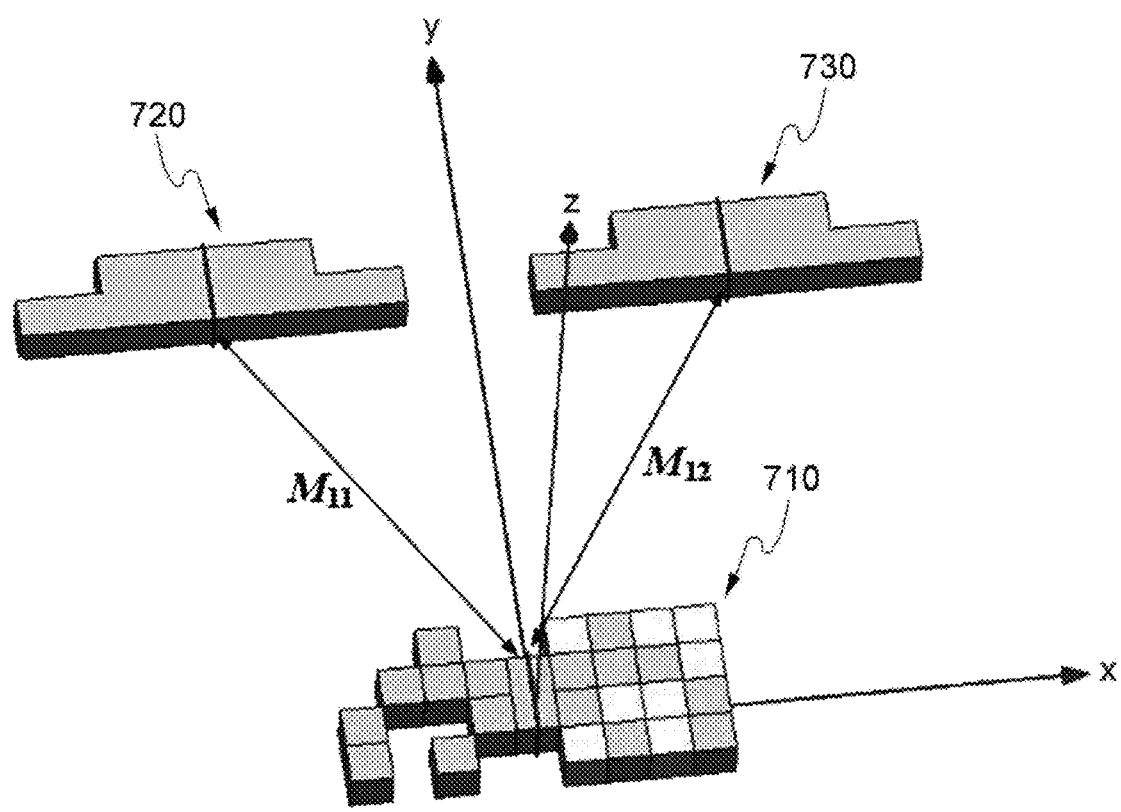

FIGS. 6 and 7 are diagrams illustrating examples of the cases where a core is designed by using the shape design technology according to the exemplary embodiment of the present invention.

FIG. 6 illustrates an example in which a transmission core 610 that matches one reception core 620 is designed, and FIG. 7 illustrates an example in which a transmission core 710 that matches two reception cores 720 and 730 is designed.

As described above, when the shape design technology of the present invention is used, it is possible not only to design the optimal transmission core that matches one reception core, but also design the optimal transmission core that matches the plurality of reception cores.

Figure 8:
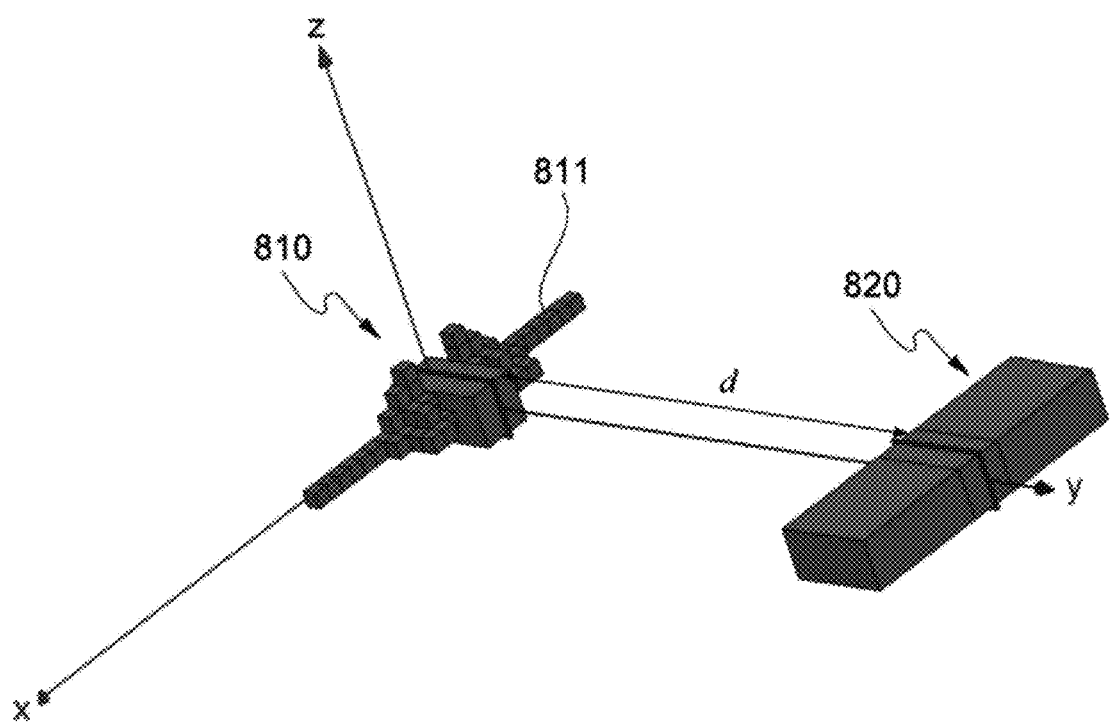
FIGS. 8 and 9 are diagrams illustrating other examples of the cases where a core is designed by using the shape design technology according to the exemplary embodiment of the present invention.
Figure 9:
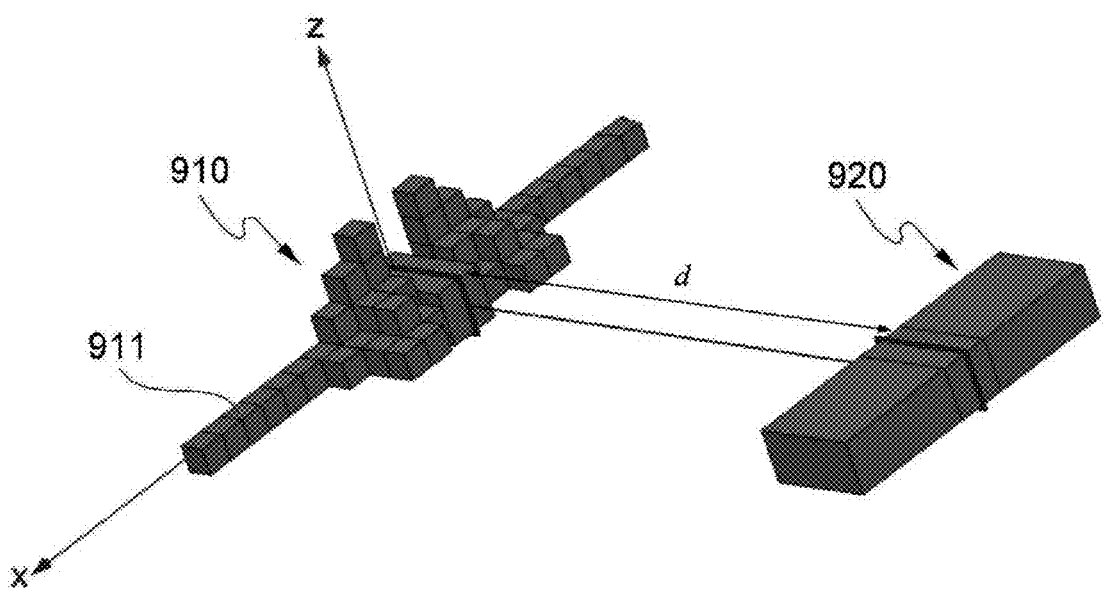

FIGS. 8 and 9 are diagrams illustrating other examples of the cases where a core is designed by using the shape design technology according to the exemplary embodiment of the present invention.

Reception cores 820 and 920 illustrated in FIGS. 8 and 9 have the same size, but a size of a block 811 used for designing the transmission core 810 in FIG. 8 is different from a size of a block 911 used for designing the transmission core 910 in FIG. 9.

As described above, when the shape design technology of the present invention is used, it is possible to adjust the size of the block forming the shape of the design target.

Figure 10:
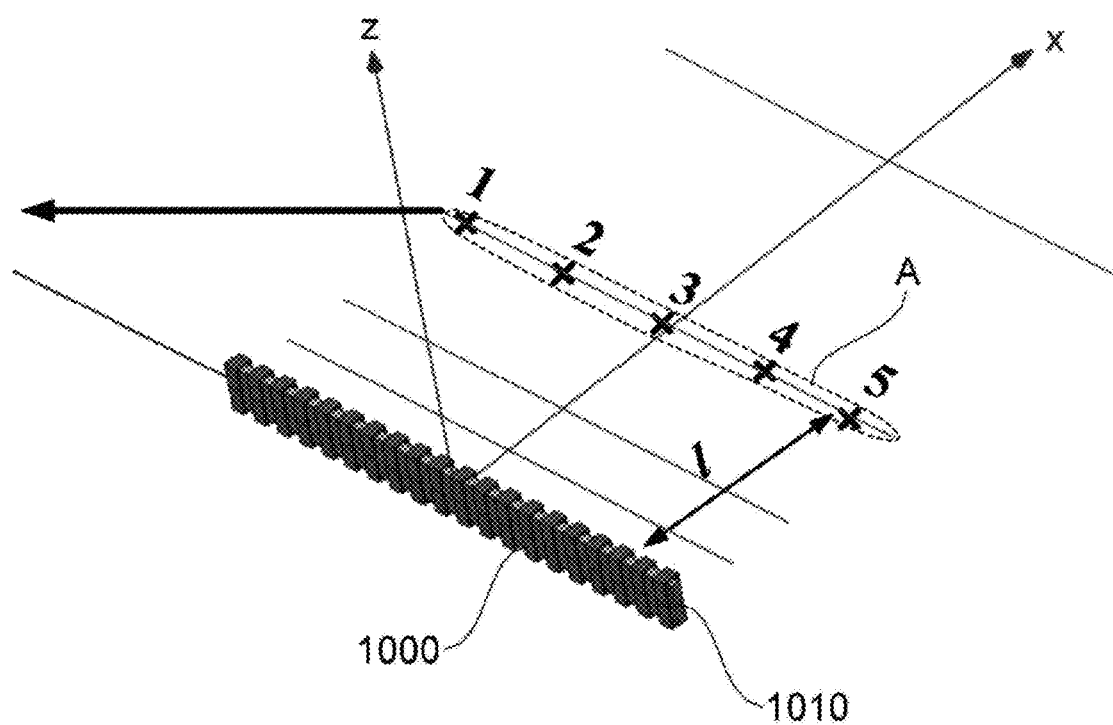
FIGS. 10 and 11 are diagrams illustrating examples of the cases where a coil is designed by using the shape design technology according to the exemplary embodiment of the present invention.
Figure 11:
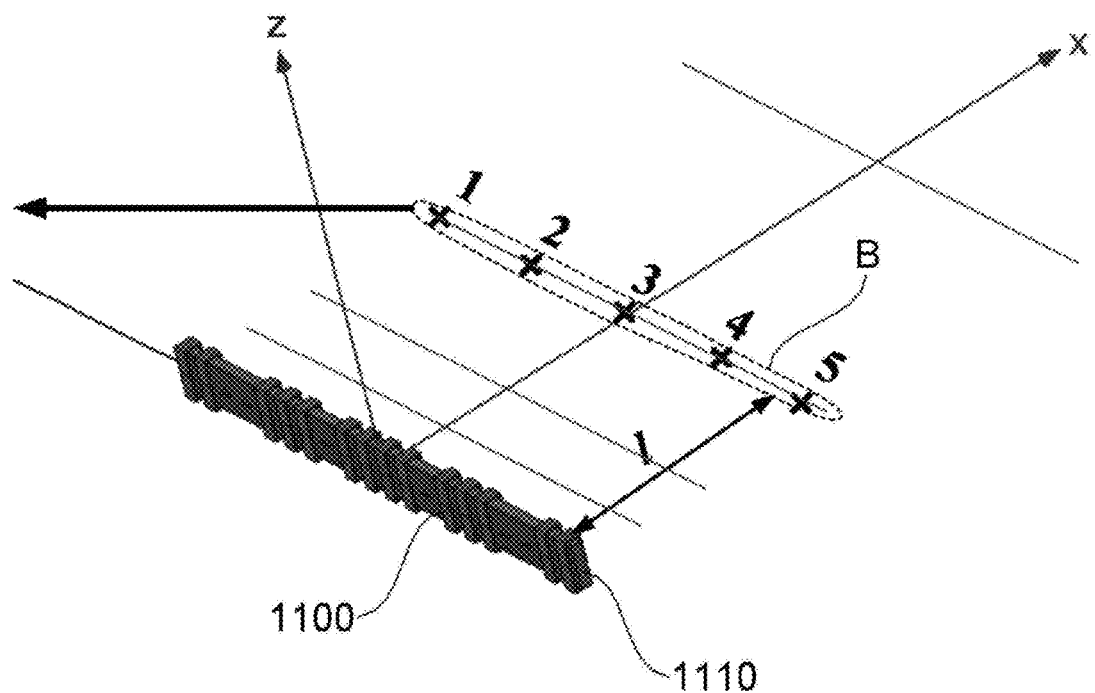

FIGS. 10 and 11 are diagrams illustrating examples of the cases where a coil is designed by using the shape design technology according to the exemplary embodiment of the present invention.

Figure 12:
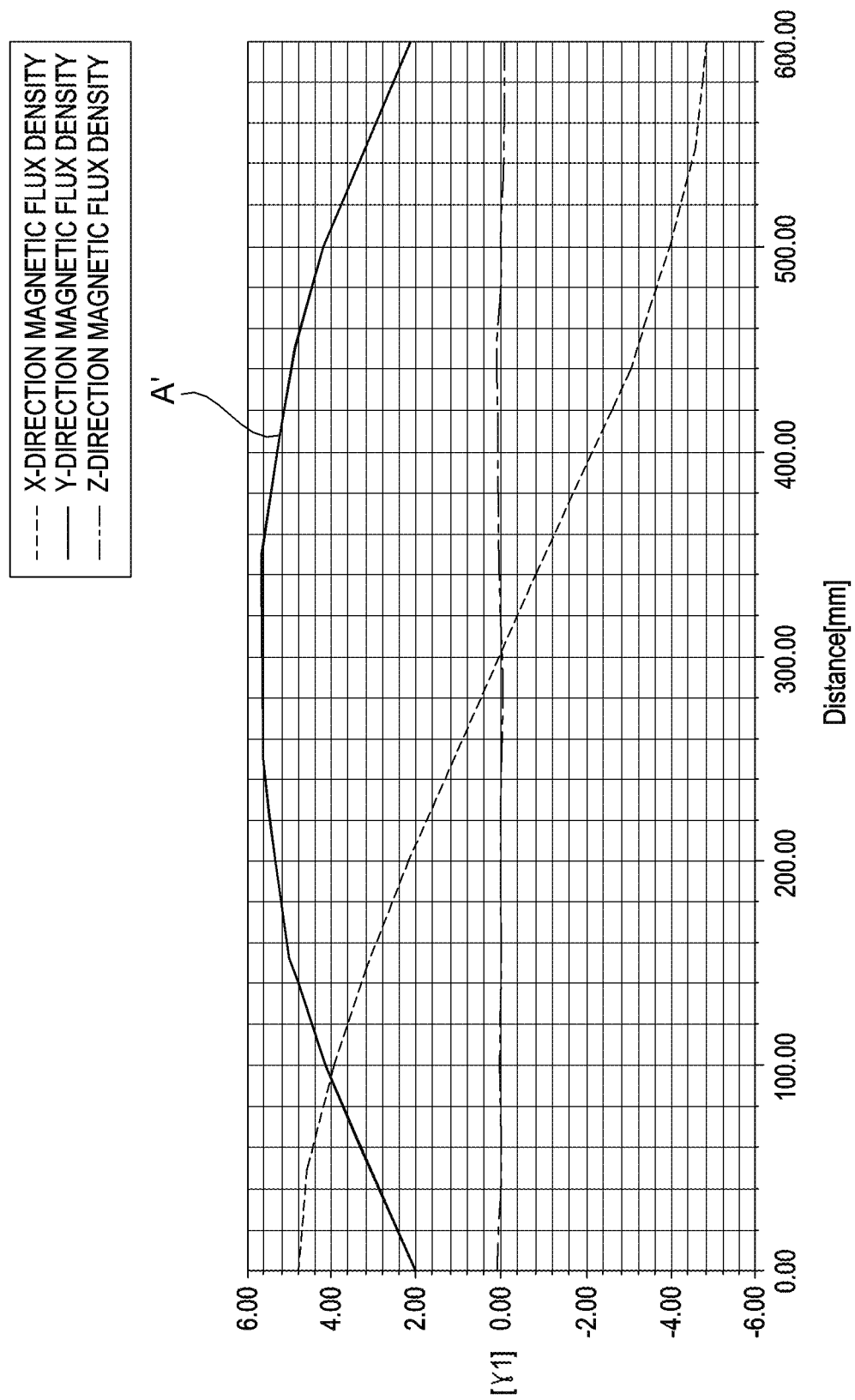
FIG. 12 is a graph illustrating a distribution of a magnetic flux density measured in a predetermined spaced area in the state where the coil is designed as illustrated in FIG. 10.
Figure 13:
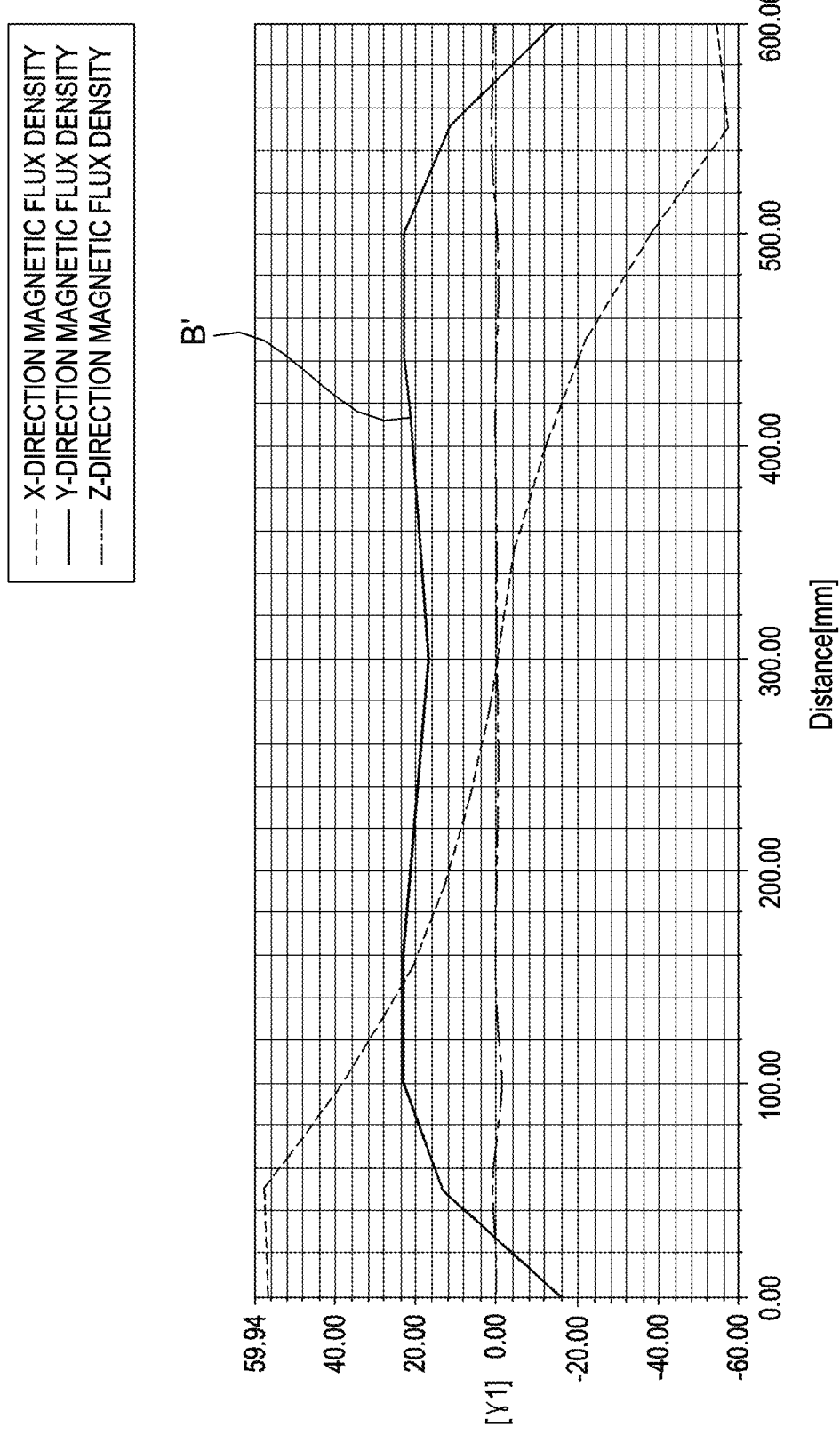
FIG. 13 is a graph illustrating a distribution of a magnetic flux density measured in a predetermined spaced area in the state where the coil designed as illustrated in FIG. 11.

FIG. 12 is a graph illustrating a magnetic flux density distribution measured in a predetermined spaced area in the state where the coil is designed as illustrated in FIG. 10, and FIG. 13 is a graph illustrating a magnetic flux density distribution measured in a predetermined spaced area in the state where the coil designed as illustrated in FIG. 11.

In FIGS. 10 and 11, the initial value (0) means that the coil at the position corresponding to the component within the shape information is not applied, and the setting value (1) means that the coil at the position corresponding to the component within the shape information is applied.

In FIGS. 10 and 11, all other conditions except for coils 1000 and 1100 were applied identically, and only the number of turns of coils 1000 and 1100 wound around the cores 1010 and 1110 was applied differently.

The shape (or the number of wound turns) of the coil 1000 of FIG. 10 is the case where a 1×20 matrix having components [1, 1, 1, 1, 1, 1, 1, 1, 1, 1, 1, 1, 1, 1, 1, 1, 1, 1, 1, 1] is input as the shape information, and the shape of the coil 1100 of FIG. 11 is the case where a 1×20 matrix having components [1, 1, 0, 0, 1, 1, 1, 0, 1, 1, 1, 1, 0, 1, 1, 1, 0, 0, 1, 1] is input as the shape information.

Referring to FIGS. 12 and 13, it can be seen that the magnetic flux density distribution (A' of FIG. 12) in area A measured in the state where the coil 1000 is wound around the core 1010 as illustrated in FIG. 10 is different from the magnetic flux density distribution (B' of FIG. 13) in area B measured in the state where the coil 1100 is wound around the core 1110 as illustrated in FIG. 11.

That is, when the shape design technology of the present invention is used, it is possible to design a coil to have a desired magnetic flux density distribution.

Even though all constituent elements constituting the exemplary embodiment of the present invention described above are described as being combined in one or as operated in combination, the present invention is not necessarily limited to the exemplary embodiment. That is, within the range of the object of the present invention, one or more components among all of the constituent elements may also be selectively combined and operated. In addition, although each of all of the constituent elements may be implemented as one independent hardware, some or all of the constituent elements may be selectively combined and implemented as a computer program including a program module that performs some functions or all functions combined in one or plural hardware. Further, the computer program is stored in a computer readable media, such as a USB memory, a CD disk, and a flash memory, and read and executed by a computer, to implement the exemplary embodiment of the present invention. The recording media of the computer program may include a magnetic recording medium, an optical recording medium, a carrier wave medium, and the like.

As described above, the shape design system and method for wireless power transmission system according to the present invention have been described according to the exemplary embodiment, but the scope of the present invention is not limited to a specific exemplary embodiment, and may be variously alternated, modified, and changed within the range that is apparent to those skilled in the art in relation to the present invention.

Accordingly, the exemplary embodiment described in the present invention and the accompanying drawings are for describing the technical spirit of the present invention rather than limiting the technical spirit of the present invention, and the scope of the technical spirit of the present invention is not limited by the exemplary embodiment and the accompanying drawings. The protective scope of the present invention should be construed by the claims, and all of the technical spirits within the scope equivalent thereto should be construed as being included in the scope of the right of the present invention.

EXPLANATION OF REFERENCE NUMERALS AND SYMBOLS

100: Shape design system
110: Learning module
120: Analysis module
130: Output module
310, 410, 510, 610, 710, 810, 910: Transmission core
320, 420, 520, 620, 720, 730, 820, 920: Reception core

The invention claimed is:

1. A shape design system for a wireless power transmission system, the shape design system comprising:
a learning module configured to perform learning based on shape information and compensation information input in relation to a design target and generate new shape information; and
an analysis module configured to evaluate wireless power transmission performance based on the shape information from the learning module and provide the learning module with a performance evaluation result.

2. The shape design system of claim 1, wherein the shape information is formed of a matrix structure consisting of a plurality of components used for regulating a shape of the design target.

3. The shape design system of claim 1, wherein the learning module is implemented to change a value of the component in the shape information through a learning process and change the shape of the design target.

4. The shape design system of claim 1, wherein all of the components in the shape information have an initial value at an initial stage, and have the initial value or a setting value according to a learning performance result after the learning by compensation is performed.

5. The shape design system of claim 1, wherein the learning module is implemented to perform the learning by receiving initial shape information at an initial stage of the learning, and then perform the learning based on new shape information generated as a result of the learning and the performance evaluation result from the analysis module.

6. The shape design system of claim 1, wherein the analysis module is implemented to perform an analysis on performance influencing variables when the wireless power transmission performance is evaluated, and evaluate the wireless power transmission performance based on an analysis result.

7. The shape design system of claim 6, wherein the performance influencing variable includes at least one or more selected from magnetic flux density, transmission coil inductance, reception coil inductance, mutual inductance between a transmitter and a receiver, a coupling coefficient, transmission coil resistance, reception coil resistance, received power, and system efficiency.

8. The shape design system of claim 1, wherein the learning module is implemented to continuously perform the learning based on the shape information and the performance evaluation result until a predetermined learning termination condition is satisfied.

9. The shape design system of claim 8, wherein the learning module is implemented to count the number of times of the learning performance after the learning performance, and determine that the learning termination condition is satisfied when the number of times of the learning performance reaches the maximum number of times of the learning performance.

10. The shape design system of claim 8, wherein the learning module is implemented to compare a previous performance evaluation result and a current performance evaluation result, and determine that the learning termination condition is satisfied when a difference between the two results is within a set range.

11. The shape design system of claim 1, wherein the component in the shape information is imaged and displayed in a block on an output module, a size of the block is adjustable, and the block is imaged and displayed two-dimensionally or three-dimensionally.

12. A shape design method for a wireless power transmission system, the shape design method comprising:
inputting initial shape information related to a design target;
generating learning shape information by performing learning based on the initial shape information;
evaluating wireless power transmission performance through an analysis of the learning shape information and then generating a performance evaluation result; and
generating new learning shape information by performing learning based on the performance evaluation result and the learning shape information.

13. The shape design method of claim 12, wherein the initial shape information has an initial value, and has a matrix structure consisting of a plurality of components used for regulating a shape of the design target.

14. The shape design method of claim 12, wherein the component in the initial shape information is changed according to the performance of the learning, so that the learning shape information is generated.

15. The shape design method of claim 12, wherein the analysis of the learning shape information is performed on performance influencing variables affecting performance of the wireless power transmission.

16. The shape design method of claim 15, wherein the performance influencing variable includes at least one or more selected from magnetic flux density, transmission coil inductance, reception coil inductance, mutual inductance between a transmitter and a receiver, a coupling coefficient, transmission coil resistance, reception coil resistance, received power, and system efficiency.

17. The shape design method of claim 12, wherein the generating of the performance evaluation result and the generating of the new learning shape information are continuously performed until a predetermined termination condition is satisfied.

18. The shape design method of claim 17, wherein the termination condition is the case where the number of times of the learning performance counted according to the learning performance reaches the maximum number of times of the learning performance.

19. The shape design method of claim 17, wherein the termination condition is the case where a difference between a previous performance evaluation result and a current performance evaluation result is within a set range.

20. The shape design method of claim 12, further comprising:
imaging the component in the shape information in a block having a preset size and displaying the imaged block on two-dimensionally or three-dimensionally.

* * * * *